United States Patent
Ha

(10) Patent No.: US 9,960,350 B2
(45) Date of Patent: May 1, 2018

(54) METHOD OF FABRICATING SWITCHING ELEMENT AND METHOD OF MANUFACTURING RESISTIVE MEMORY DEVICE

(71) Applicant: SK hynix Inc., Icheon (KR)

(72) Inventor: Tae Jung Ha, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days. days.

(21) Appl. No.: 15/435,144

(22) Filed: Feb. 16, 2017

(65) Prior Publication Data

US 2017/0352807 A1 Dec. 7, 2017

(30) Foreign Application Priority Data

Jun. 3, 2016 (KR) .................. 10-2016-0069870

(51) Int. Cl.
- *H01L 45/00* (2006.01)
- *H01L 27/00* (2006.01)
- *H01L 27/24* (2006.01)

(52) U.S. Cl.
CPC ........ *H01L 45/165* (2013.01); *H01L 27/2427* (2013.01); *H01L 45/06* (2013.01); *H01L 45/1233* (2013.01); *H01L 45/1253* (2013.01); *H01L 45/145* (2013.01); *H01L 45/142* (2013.01); *H01L 45/143* (2013.01); *H01L 45/146* (2013.01); *H01L 45/147* (2013.01)

(58) Field of Classification Search
CPC .................. H01L 27/2427; H01L 27/15; H01L 27/11568; H01L 27/521; H01L 45/165; H01L 45/06; H01L 45/1233; H01L 45/1253; H01L 45/145; H01L 45/142; H01L 45/143; H01L 45/146; H01L 45/147

See application file for complete search history.

(56) References Cited

U.S. PATENT DOCUMENTS

| | | | | |
|---|---|---|---|---|
| 8,520,425 | B2 * | 8/2013 | Xiao | G11C 13/0007 365/148 |
| 9,257,431 | B2 * | 2/2016 | Ravasio | H01L 45/04 |
| 2012/0176831 | A1 * | 7/2012 | Xiao | G11C 13/0007 365/148 |
| 2015/0084156 | A1 * | 3/2015 | Ravasio | H01L 45/04 257/528 |

FOREIGN PATENT DOCUMENTS

| | | |
|---|---|---|
| KR | 10-2004-0095970 A | 11/2004 |
| KR | 10-1017051 B1 | 2/2011 |

* cited by examiner

*Primary Examiner* — Nikolay Yushin

(57) ABSTRACT

A method of manufacturing a switching element includes forming a first electrode layer over a substrate, forming a switching structure on the first electrode layer, and forming a second electrode layer on the switching structure. The switching structure includes a plurality of unit switching layers that includes a first unit switching layer and a second unit switching layer. Forming the first unit switching layer includes forming a first unit insulation layer, and injecting first dopants into the first unit insulation layer by performing a first ion implantation process. Forming the second unit switching layer includes forming a second unit insulation layer, and injecting second dopants into the second unit insulation layer by performing a second implantation process.

20 Claims, 20 Drawing Sheets

METHOD OF FABRICATING SWITCHING ELEMENT AND METHOD OF MANUFACTURING RESISTIVE MEMORY DEVICE

CROSS-REFERENCE TO RELATED APPLICATION

The present application claims priority under 35 U.S.C. 119(a) to Korean Patent Application No. 10-2016-0069870, filed on Jun. 3, 2016, which is herein incorporated by reference in its entirety.

BACKGROUND

1. Technical Field

Various embodiments of the present disclosure relate to a semiconductor memory and, more particularly, to a method of fabricating a switching element, and a method of fabricating a resistive memory device including the switching element.

2. Related Art

A cross-point memory array structure has been employed in a cell region of a highly integrated memory device. More specifically, the cross-point memory array structure has been included in memories, such as a Resistive Random Access Memory (ReRAM), a Phase Change Random Access Memory (PCRAM), a Magnetic Random Access Memory (MRAM) and so on, as a cell structure. The cell structure includes a pillar interposed between electrodes, the electrodes being disposed on different planes and intersecting with each other.

Meanwhile, in the cross-point memory array structure, an undesired sneak current may be generated between adjacent cells, and may result in writing errors or reading errors. In order to suppress these errors, a selection device has been employed in a memory cell. Switching devices, such as transistors, diodes, tunnel barrier devices, and ovonic threshold switches, have been used as selection devices.

SUMMARY

Various embodiments are directed to a method of fabricating a switching element, and a method of fabricating a resistive memory device including the switching element.

According to an embodiment, there is provided a method of manufacturing a switching element. The method includes forming a first electrode layer over a substrate, forming a switching structure on the first electrode layer, and forming a second electrode layer on the switching structure. The switching structure includes a plurality of unit switching layers that includes a first unit switching layer and a second unit switching layer. Forming the first unit switching layer includes forming a first unit insulation layer, and injecting first dopants into the first unit insulation layer by performing a first ion implantation process. Forming the second unit switching layer includes forming a first unit insulation layer, and injecting first dopants into the first unit insulation layer by performing a first ion implantation process.

According to an embodiment, there is provided a method of manufacturing a resistive memory device. The method includes forming a first electrode layer over a substrate, forming a switching structure on the first electrode layer, forming a second electrode layer on the switching structure, forming a resistive memory material layer on the second electrode, and forming a third electrode layer on the resistive memory material layer. The switching structure includes a plurality of unit switching layers that includes a first unit switching layer and a second unit switching layer. Forming the first unit switching layer includes forming a first unit insulation layer, and injecting first dopants into the first unit insulation layer by performing a first ion implantation process. Forming the second unit switching layer includes forming a second unit insulation layer, and injecting second dopants into the second unit insulation layer by performing a second ion implantation process.

BRIEF DESCRIPTION OF THE DRAWINGS

Various embodiments of the present disclosure will become more apparent in view of the attached drawings and accompanying detailed description, in which.

DETAILED DESCRIPTION

Figure 1:
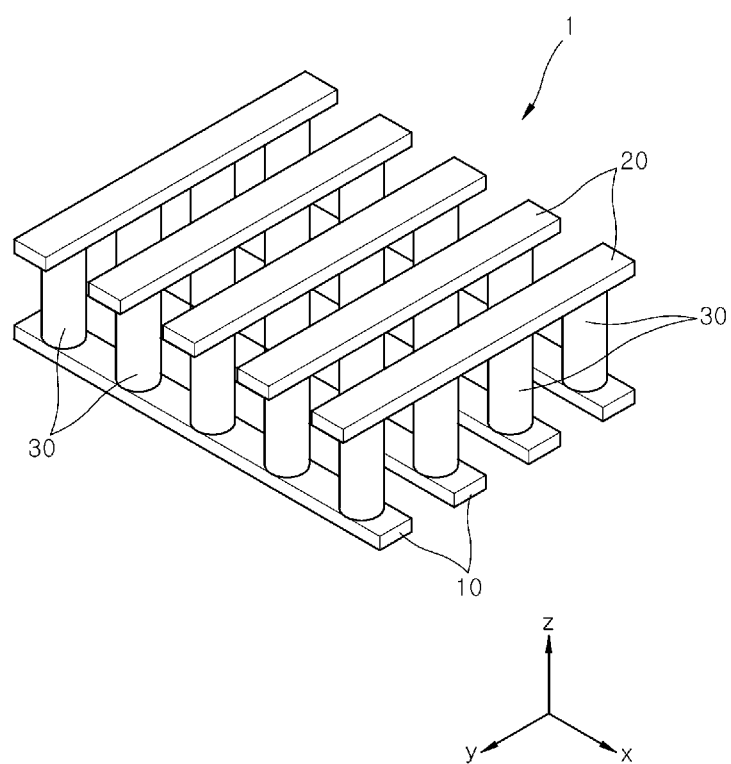
FIG. 1 is a perspective view illustrating a cross-point array device according to an embodiment.

Embodiments of the present disclosure will be described hereinafter with reference to the accompanying drawings. In the drawings, the size, widths, and/or thickness of components may be slightly increased in order to clearly express the components of each device. The drawings are described in the observer's point overall, thus, the expression "upper" or "lower" described herein may also be interpreted as "lower" and "lower" or "upper" in accordance with a change of the observer's view point. If an element is referred to be located on another element, it may be understood that the element is directly located on the other element, or an additional element may be interposed between the element and the other element. The same reference numerals refer to the same elements throughout the specification.

In addition, expression of the singular form should be understood to include the plural forms unless clearly used otherwise in the context. It will be understood that the terms "comprise" or "have" are intended to specify the presence of a feature, a number, a step, an operation, an element, a part or combinations thereof, but not used to preclude the presence or possibility of addition one or more other features, numbers, steps, operations, components, parts or combinations thereof.

In accordance with an embodiment of the present disclosure, there may be provided a switching element (or a switching device) performing a threshold switching operation. The threshold switching operation of the switching element described herein will be understood, in which the switching element has a turned-on state or a turned-off state, as will be described below, according to an external voltage applied to the switching element.

At first, as an absolute value of the external voltage applied to the switching element increases from an initial state, an operation current of the switching element may be nonlinearly increased after the applied external voltage becomes equal to or greater than a predetermined first threshold voltage. In accordance with this phenomenon, the switching element is turned on. After that, as the absolute value of the external voltage applied to the switching element gradually decreases from the turn-on state, the operation current of the switching element may be nonlinearly decreased after the applied external voltage becomes lower than a predetermined second threshold voltage. In accordance with this phenomenon, the switching element is turned off. As such, the switching element performs the threshold switching operation.

Methods of fabricating a switching element and a resistive random access memory device may be applied to methods of fabricating various types of switching elements and resistive random access memory devices including the switching element. Hereinafter, a cross-point array device fabricated using a method of manufacturing a switching element according to an embodiment will be described.

Figure 2:
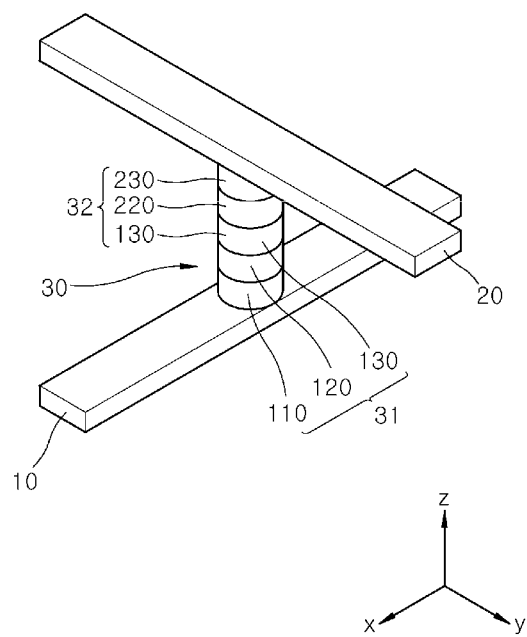
FIG. 2 is an enlarged view illustrating a portion of the cross-point array device shown in FIG. 1.

FIG. 1 is a perspective view schematically illustrating a cross-point array device 1 according to an embodiment. FIG. 2 is an enlarged view illustrating a portion of the cross-point array device 1 shown in FIG. 1.

Referring to FIG. 1, the cross-point array device 1 includes first conductive lines 10 extending in an X-axis direction, second conductive lines 20 extending in a Y-axis direction, and pillar-shaped structures 30. The pillar-shaped structures 30 are disposed at regions where the first conductive lines 10 and the second conductive lines 20 intersect, and the pillar-shaped structures 30 extend in a Z-axis direction. Although FIG. 1 illustrates an example in which a three-dimensional rectangular coordinate system of the X-axis direction, the Y-axis direction, and the Z-direction is used, embodiments of the present disclosure are not limited to the rectangular coordinate system. There may be various modifications of non-rectangular coordinate systems to satisfy a condition that the X-axis direction and the Y-axis direction may intersect with each other at a non-perpendicular angle, and the Z-direction may be perpendicular to both of the X-axis direction and the Y-axis direction. The pillar-shaped structures 30 may be arranged to form a plurality of arrays along the X-axis direction and the Y-axis direction.

Referring to FIG. 2, each of the pillar-shaped structures 30 may include a lower electrode 110, a switching structure 120, a middle electrode 130, a resistive memory layer 220, and an upper electrode 230. The lower electrode 110, the switching structure 120, and the middle electrode 130 may constitute a selection element 31 as a switching element. The middle electrode 130, the resistive memory layer 220, and the upper electrode 230 may constitute a variable resistive element 32. The selection element 31 may share the middle electrode 130 with the variable resistive element 32. Accordingly, the cross-point array device 1 illustrated in FIGS. 1 and 2 may function as an ReRAM device including memory cells, each of which is comprised of the selection element 31 and the variable resistive element 32.

The ReRAM device may be defined as a memory device that stores data in a selected one from the pillar-shaped structures 30 disposed between the first conductive lines 10 and the second conductive lines 20, based on an amount of a current flowing through the selected pillar-shaped structure 30. In some embodiments, the cross-point array device 1 may function as an ReRAM device, a PCRAM device, or a MRAM device. The selection element 31 may perform a threshold switching operation in response to an external voltage applied thereto, rather than having a memory characteristic. In contrast, the variable resistive element 32 may have a memory characteristic depending on an electrical resistance value thereof.

The selection element 31 may suppress an occurrence of a sneak current between adjacent pillar-shaped structures 30 while the cross-point array device 1 operates. In an embodiment, an amount of the sneak current may be proportional to an amount of an off-current generated in the selection element 31 when the selection element 31 is in a turned-off state.

The selection element 31 may include the switching structure 120 that performs a threshold switching operation. The switching structure 120 may include a plurality of unit switching layers formed by a fabricating method illustrated in FIGS. 5 to 9 that will be described later. Each of the unit switching layers may correspond to a unit insulation layer doped with dopants. In some embodiments, the unit insulation layer may include a silicon oxide material, a silicon nitride material, a metal oxide material, a metal nitride material, or a combination thereof. In some embodiments, the unit insulation layer may include an aluminum oxide material, a zirconium oxide material, a hafnium oxide material, a tungsten oxide material, a titanium oxide material, a nickel oxide material, a copper oxide material, a manganese oxide material, a tantalum oxide material, a niobium oxide material, or an iron oxide material. The unit insulation layer may include a compound having a composition that does not satisfy a stoichiometric ratio. The unit insulation layer may have an amorphous structure.

The dopants that are doped in the unit insulation layer may form trap sites for conductive carriers moving in the corresponding unit switching layer. The trap sites may capture the conductive carriers moving in the unit switching layer or provide a moving path for the captured conductive carriers, in response to an external voltage applied to the pillar-shaped structures 30. As a result, the selection element 31 may implement the threshold switching operation characteristic as described above.

Various materials that generate an energy level capable of accommodating the conductive carriers in the unit switching layer may be used as the dopants. In an embodiment, the dopant may include a metal element having an atomic number which is different from that of silicon or that of a metal element constituting the unit insulation layer.

In some embodiments, in a case that the unit insulation layer includes a silicon oxide material or a silicon nitride material, the dopants may include at least one selected from aluminum (Al), lanthanum (La), niobium (Nb), vanadium (V), tantalum (Ta), tungsten (W), chrome (Cr), molybdenum (Mo), boron (B), nitrogen (N), carbon (C), phosphorus (P), and arsenic (As). In other embodiments, in a case that the unit insulation layer is an aluminum oxide material or an aluminum nitride material, the dopants may include at least one selected from titanium (Ti), copper (Cu), zirconium (Zr), hafnium (Hf), niobium (Nb), vanadium (V), tantalum (Ta), tungsten (W), chrome (Cr), molybdenum (Mo), boron (B), nitrogen (N), carbon (C), phosphorus (P), and arsenic (As).

The variable resistive element 32 may be electrically connected to the selection element 31 in series. In the variable resistive element 32, each of the middle electrode 130, and the upper electrode 230 may include a metal material, a conductive nitride material, or a conductive oxide material. In some embodiments, each of the middle electrode 130 and the upper electrode 230 may include gold (Au), aluminum (Al), platinum (Pt), copper (Cu), silver (Ag), ruthenium (Ru), titanium (Ti), iridium (Ir), tungsten (W), titanium nitride (TiN), tantalum nitride (TaN), ruthenium oxide ($RuO_2$), or the like.

In the variable resistive element 32, the resistive memory layer 220 may include a material that switches from a high resistive state to a low resistive state, or from the low resistance state to the high resistive state, according to an external voltage applied thereto. In some embodiments, the resistive memory layer 220 may include a metal oxide material such as a titanium oxide material, an aluminum oxide material, a nickel oxide material, a copper oxide material, a zirconium oxide material, a manganese oxide material, a hafnium oxide material, a tungsten oxide material, a tantalum oxide material, a niobium oxide material, or an iron oxide material.

In other embodiments, the resistive memory layer 220 may include a perovskite material such as a praseodymium calcium manganese oxide ($Pr_{0.7}Ca_{0.3}MnO_3$) material, a $La_{1-x}Ca_xMnO_3$ (LCMO) material, a $Ba_{0.5}Sr_{0.5}Co_{0.8}Fe_{0.2}O_{3-\delta}$ (BSCFO) material, a $YBa_2Cu_3O_{7-x}$ (YBCO) material, a $(Ba,Sr)TiO_3$(Cr,Nb-doped) material, a $SrZrO_3$(Cr,V-doped) material, a $(La,Sr)MnO_3$ material, a $Sr_{1-x}La_xTiO_3$ material, a $La_{1-x}Sr_xFeO_3$ material, a $La_{1-x}Sr_xCoO_3$ material, a $SrFeO_{2.7}$ material, a $LaCoO_3$ material, a $RuSr_2GdCu_2O_3$ material, or a $YBa_2Cu_3O_7$ material.

In yet other embodiments, the resistive memory layer 220 may include a selenide material such as a $Ge_xSe_{1-x}$(Ag,Cu,Te-doped), or a metal sulfide material, for example, an $Ag_2S$ material, a $Cu_2S$ material, a CdS material, or a ZnS material.

Figure 3:
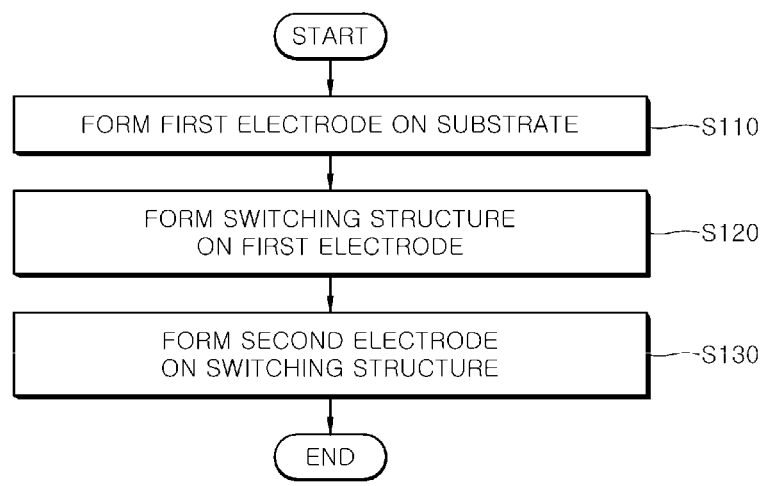
FIG. 3 is a flow chart illustrating a method of fabricating a switching device according to an embodiment.
Figure 4:
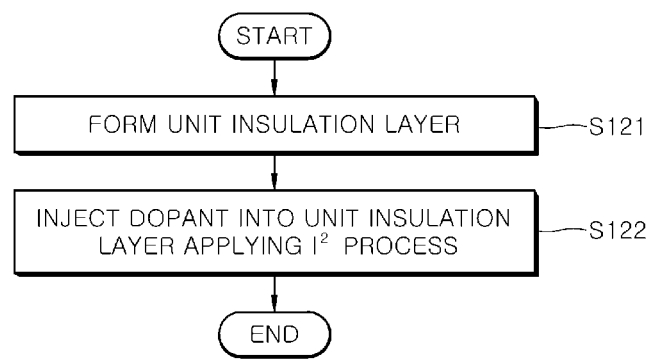
FIG. 4 is a flow chart illustrating a step of forming a switching structure shown in FIG. 3.

FIG. 3 is a flow chart illustrating a method of manufacturing a switching element according to an embodiment. FIG. 4 is a flow chart illustrating step S120 of FIG. 3 in more detail. The method of manufacturing the switching element may be employed in fabricating the switching element 31 of FIG. 2 included in the cross-point array device 1 of FIG. 1.

Referring to FIG. 3, at step S110, a first electrode layer may be formed on a substrate. The substrate may be a silicon substrate or a gallium arsenide substrate. However, embodiments of the present disclosure are not limited thereto. For example, in some embodiments, the substrate may be a ceramic substrate, a polymer substrate, or a metallic substrate to which semiconductor processes are applicable. The first electrode layer may include a metal material, a conductive metal nitride material, or a conductive metal oxide material.

At step S120, a switching structure may be formed on the first electrode layer. The switching structure may be formed by performing two or more processes to respectively form two or more unit switching layers. Each of the processes to form a corresponding unit switching layer may include, referring to FIG. 4, a unit insulation layer forming step S121, and a doping step S122 to inject dopants into the unit insulation layer using an ion implantation process. In an embodiment, thicknesses of the unit insulation layers may be substantially equal to each other. In another embodiment, at least one of the unit insulation layers may have a thickness different from thicknesses of the other unit insulation layers. In an embodiment, process conditions such as a type of the dopants, an ion injecting power, and a dose may be kept substantially the same for each of the unit switching layer forming processes. Alternatively, at least one of the process conditions may be changed for each of the unit switching layer forming processes.

In an embodiment, the unit insulation layer forming step S121 may include forming a compound layer having an amorphous structure. In an embodiment, the unit insulation layer forming step S121 may include forming a compound layer having a nonstoichiometric composition. In an embodiment, the unit insulation layer may include an oxide material having a first element or a nitride material having the first element. The unit insulation layer may include a silicon oxide material, a silicon nitride material, a metal oxide material, or a metal nitride material. That is, the silicon oxide material and the silicon nitride material have silicon as the first element, and the metal oxide material and the metal nitride material have a metal element as the first element.

At step S122, the doping step may be performed such that a projection range point Rp of an ion injecting process is located inside the unit insulation layer. For example, the projection range point Rp corresponds to a projected range of injected dopants, where a distribution of the injected dopants has a peak at the projection range point Rp. In an embodiment, the dopant may include a second element that has a different atomic number from the first element of the unit insulation layer. In some embodiments, if the unit insulation layer includes a silicon oxide material or a silicon nitride material, the dopants may include at least one of aluminum (Al), lanthanum (La), niobium (Nb), vanadium (V), tantalum (Ta), tungsten (W), chrome (Cr), molybdenum (Mo), boron (B), nitrogen (N), carbon (C), phosphorus (P), and arsenic (As). In other embodiments, if the unit insulation layer includes an aluminum oxide material or an aluminum nitride material, the dopants may include at least one of titanium (Ti), copper (Cu), zirconium (Zr), hafnium (Hf), niobium (Nb), vanadium (V), tantalum (Ta), tungsten (W), chrome (Cr), molybdenum (Mo), boron (B), nitrogen (N), carbon (C), phosphorus (P), and arsenic (As). The dopants may generate trap sites in the unit insulation layer, which capture conductive carriers or provide a moving path of the conductive carriers between the first electrode layer and a second electrode layer, according to a level of a voltage applied to the first and second electrode layers. The switching structure may be formed by performing two or more times the above-described unit switching layer forming process that includes the unit insulation layer forming step S121 and the doping step S122 as illustrated in FIG. 4.

In an embodiment, during performing the two or more unit switching layer forming processes, an additional doping process may be performed. In another embodiment, after performing a first unit switching layer forming process and a second unit switching layer forming process, a post-dopant injection process may be performed. The post-dopant injection process may additionally inject dopants to the first unit switching layer, the second unit switching layer, or to the first and second unit switching layers. The dopants used in the post-dopant injection process may have the same type as the dopants used in the first and second unit switching layer forming processes. Alternatively, the dopants used in the post-dopant injection process may have a type that is different from that of the dopants used in the first and second unit switching layer forming processes.

A dose of the dopants injected during the post-dopant injection process may be greater than a dose of the dopants injected during the first and second unit switching layer forming processes. In an embodiment, energy of the post-dopant injection process may be determined such that a projection range point Rp is located inside the first unit switching layer or the second unit switching layer. In another embodiment, the energy of the post-dopant injection process may be determined such that the projection range point Rp is located at a boundary between the first unit switching layer and the second unit switching layer. Meanwhile, after performing the post-dopant injection process, at least one unit switching layer forming process may be additionally performed.

In an embodiment, the post-dopant injection process may be periodically performed after performing each unit switching layer forming process. In another embodiment, the post-dopant injection process may be periodically performed after performing two unit switching layer forming processes.

Referring back to FIG. 3, at step S130, the second electrode layer may be formed on the switching structure. In some embodiments, the second electrode layer may include a metal material, a conductive nitride material, a conductive oxide material, or the like. The second electrode layer, the switching structure, and the first electrode layer may be patterned to form a pattern structure (e.g., the switching element 31 of the pillar-shaped structure 30 shown in FIGS. 1 and 2).

The switching device according to an embodiment of the present disclosure may be manufactured by performing the above-described processes. Hereinafter, the method of manufacturing the switching element will be described below in more detail with reference to FIGS. 5 and 10.

FIGS. 5 to 10 are cross-sectional views illustrating a method of manufacturing a switching element according to an embodiment. The method of manufacturing the switching element may be applied to fabrication of the cross-point array device 1 described with respect to FIGS. 1 and 2.

Figure 5:
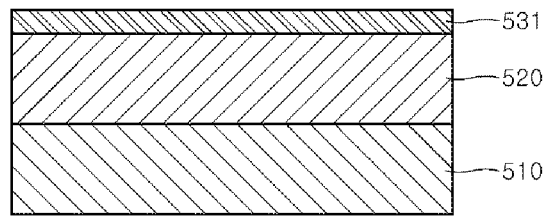
FIGS. 5 to 10 are cross-sectional views illustrating a method of fabricating a switching device according to an embodiment.

Referring to FIG. 5, a first electrode layer 520 may be formed on a substrate 510. The substrate 510 may be a silicon substrate or a gallium arsenide substrate. However, embodiments of the present disclosure are not limited thereto. For example, in some embodiments, the substrate 510 may be a ceramic substrate, a polymer substrate, or a metallic substrate to which semiconductor processes are applicable. The substrate 510 may include an integrated circuit formed therein.

The first electrode layer 520 may include a metal material, a conductive metal nitride material, a conductive metal oxide material, or the like. The first electrode layer 520 may include gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), or ruthenium oxide ($RuO_2$). The first electrode layer 520 may be formed using a sputtering process, an atomic layer deposition (ALD) process, an evaporation process, a chemical vapor deposition (CVD) process, or an electron beam deposition process.

Referring back to FIG. 5, a first unit insulation layer 531 may be formed on the first electrode layer 520. The first unit insulation layer 531 may include a compound of a nonstoichiometric composition. The first unit insulation layer 531 may include a compound having an amorphous structure. The first unit insulation layer 531 may include a silicon oxide material, a silicon nitride material, a metal oxide material, a metal nitride material, or a combination thereof. For example, the first unit insulation layer 531 may include an aluminum oxide material, a zirconium oxide material, a hafnium oxide material, a tungsten oxide material, a titanium oxide material, a nickel oxide material, a copper oxide material, a manganese oxide material, a tantalum oxide material, a niobium oxide material, or an iron oxide material. The first unit insulation layer 531 may be formed using a sputtering process, an atomic layer deposition (ALD) process, an evaporation process, a chemical vapor deposition (CVD) process, or an electron beam deposition process.

Figure 6:
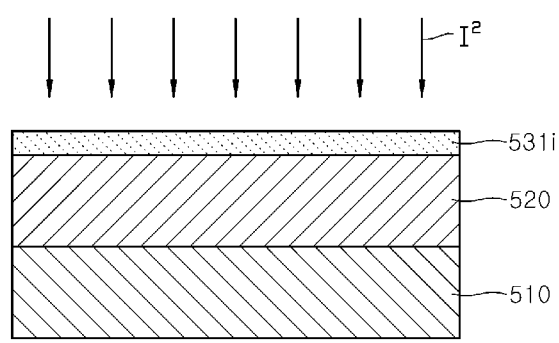

Referring to FIG. 6, a first unit switching layer 531i may be formed by injecting dopants into the first unit insulation layer 531 of FIG. 5 using an ion implantation ($I^2$) process. The dopants may generate trap sites for conductive carriers moving in the first unit switching layer 531i. In an embodiment, the dopants may include a metal element having an atomic number that is different from an atomic number of silicon or an atomic number of a metal element included in the first unit insulation layer 531 of FIG. 5. In an embodiment, if the first unit insulation layer 531 of FIG. 5 includes a silicon oxide material or a silicon nitride material, the dopants may include at least one selected from aluminum (Al), lanthanum (La), niobium (Nb), vanadium (V), tantalum (Ta), tungsten (W), chrome (Cr), molybdenum (Mo), boron (B), nitrogen (N), phosphorus (P), and arsenic (As).

In other embodiments, if the first unit insulation layer 531 includes an aluminum oxide material or an aluminum nitride material and thus the first unit insulation layer 531 includes aluminum (Al) as the metal element, the dopants may include at least one selected from titanium (Ti), copper (Cu), zirconium (Zr), hafnium (Hf), niobium (Nb), vanadium (V), tantalum (Ta), tungsten (W), chrome (Cr), molybdenum (Mo), boron (B), nitrogen (N), phosphorus (P), and arsenic (As).

In an embodiment, ion implantation energy and a dose of the dopants in the ion implantation ($I^2$) process may be determined in consideration of a thickness of the first unit insulation layer 531 of FIG. 5 such that the dopants are more uniformly distributed within the first unit switching layer 531i. For example, a difference between the maximum concentration and the minimum concentration of the dopants within the first unit switching layer 531i may be decreased. The ion implantation ($I^2$) process may be performed such that a projection range point Rp is located inside the first unit insulation layer 531 of FIG. 5.

Figure 7:
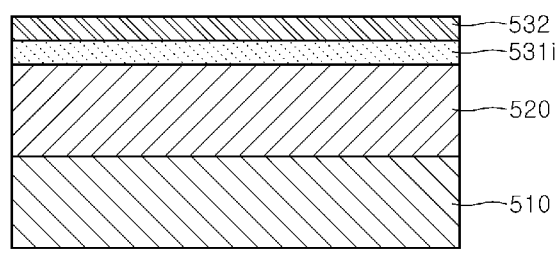

Referring to FIG. 7, a second unit insulation layer 532 may be formed on the first unit switching layer 531i. The second unit insulation layer 532 may be formed of the same material as the first unit insulation layer 531 of FIG. 5. A thickness of the second unit insulation layer 532 may be equal to or different from that of the first unit insulation layer 531 of FIG. 5. In some embodiments, the second unit insulation layer 532 may be formed using an atomic layer deposition (ALD) process, a chemical vapor deposition (CVD) process, or a coating process.

Figure 8:
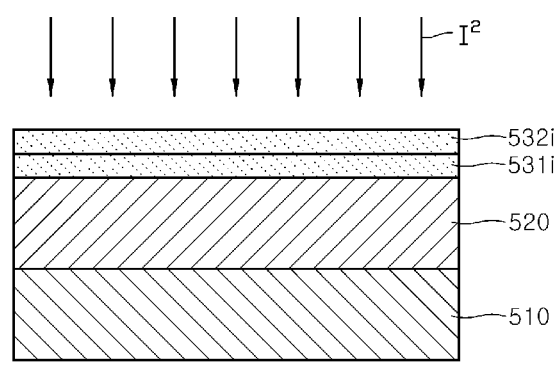

Referring to FIG. 8, a second unit switching layer 532i may be formed by injecting dopants into the second unit insulation layer 532 of FIG. 7 using an ion implantation ($I^2$) process. The ion implantation ($I^2$) process for injecting dopants into the second unit insulation layer 532 may be performed under substantially the same process conditions as the ion implantation ($I^2$) process for injecting the dopants into the first unit insulation layer 531 of FIG. 5. Specifically, in the ion implantation ($I^2$) process for injecting dopants into the second unit insulation layer 532, the same type of dopants as the dopants injected into the first unit insulation layer 531 may be injected into the second unit insulation layer 532.

In an embodiment, ion implantation energy and a dose of the ion implantation ($I^2$) process may be determined in consideration of a thickness of the second unit insulation layer 532 of FIG. 7 such that the dopants are substantially uniformly distributed within the second unit switching layer 532i. The ion implantation ($I^2$) process may be performed such that a projection range point Rp is located inside the second unit insulation layer 532 of FIG. 7.

Figure 9:
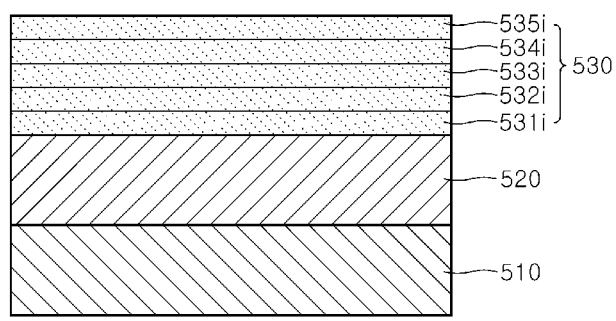

Referring to FIG. 9, third, fourth, and fifth unit switching layers 533i, 534i, and 535i may be formed by repeatedly performing a process which is performed under substantially the same process conditions as the process to form the second unit switching layer 532i as described with reference to FIGS. 7 and 8. As a result, a switching structure 530 in which the first to fifth unit switching layers 531i to 535i are stacked may be formed.

In the embodiment shown in FIG. 9, the switching structure 530 includes the five unit switching layers 531i to 535i, but the number of the stacked unit switching layers is not limited thereto. In another embodiment, the switching structure 530 may be formed to include two unit switching layers 531i and 532i by performing the above processes described with reference to FIGS. 5 and 8.

Meanwhile, when forming the first to fifth unit switching layers 531i to 535i, the first to fifth unit switching layers 531i to 535i may have substantially the same thickness with each other, or at least one of the unit switching layers 531i to 535i may have a different thickness from thicknesses of the remaining unit switching layers. A thickness of one of the unit switching layers 531i to 535i may be determined in consideration of process conditions such as a total thickness of the switching structure 530, the process reliability of the unit insulation layer forming process, the process reliability of the ion implantation process, or the like. In an embodiment, the ion implantation energy can be reduced as the thickness of the unit switching layer becomes smaller.

Meanwhile, in the ion implantation ($I^2$) process, process conditions including a type of the dopant, ion implantation energy, and a dose may be controlled to be substantially the same for each unit switching layer forming process. Alternatively, in the ion implantation ($I^2$) process, at least one of the process conditions may be controlled to be different for two or more unit switching layer forming processes.

Figure 10:
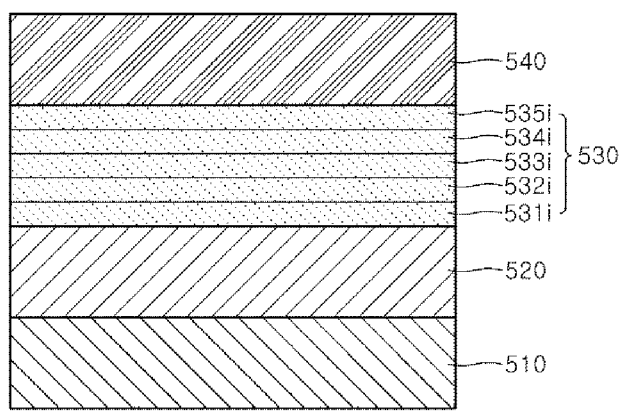

Referring to FIG. 10, a second electrode layer 540 may be formed on the switching structure 530. The second electrode layer 540 may include a metal material, a conductive metal nitride material, a conductive metal oxide material, or the like. In some embodiments, the second electrode layer 540 may include gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), or ruthenium oxide ($RuO_2$). The second electrode layer 540 may be formed using a sputtering process, an atomic layer deposition (ALD) process, an evaporation process, a chemical vapor deposition (CVD) process, or an electron beam deposition process. By performing the above-described processes, a switching element including the first electrode layer 520, the switching structure 530, and the second electrode layer 540 may be formed on the substrate 510.

Although it is not illustrated, the second electrode layer 540, the switching structure 530, and the first electrode layer 520 may be patterned to form a pattern structure on the substrate 510. The pattern structure may correspond to the switching element 31 of the pillar-shaped structure 30 shown in FIGS. 1 and 2.

In other embodiments, after the unit switching layer forming process is performed two or more times, a dopant injection process may be additionally performed. In one embodiment, a post-dopant injection process may be performed after forming the first and second unit switching layers 531i and 532i using the processes described with reference to FIGS. 5 to 8. A type of dopants injected in the post-dopant injection process may be the same as that of the dopants injected to form the first and second unit switching layers 531i and 532i. A doping concentration of the dopants injected in the post-dopant injection process may be higher than a doping concentration of dopants injected in at least one of the processes for forming the first and second unit switching layers 531i and 532i.

Ion implantation energy of the post-dopant injection process may be determined such that a projection range Rp point is located inside the first unit switching layer 531i or the second unit switching layer 532i. In an embodiment, at least one unit switching layer forming process may be additionally performed after finishing the post-dopant injection process.

In another embodiment, the post-dopant injection process may be repeatedly performed after at least one unit switching layer forming process is complete. For example, the post-dopant injection process may be repeatedly performed every time after two unit switching layer forming processes are complete.

As described above, according to the method of manufacturing the switching element according to an embodiment of the present disclosure, the switching structure may be formed by performing the unit switching layer forming process, which includes a unit insulation layer forming step and an ion injecting process to inject dopants into the unit insulation layer, at least two times.

In an embodiment, the dopant distribution may become more uniform in a switching structure by performing a dopant injection process for each of the unit insulation layers, compared with when a single dopant injection process is performed on a structure including substantially the same material and having substantially the same thickness as the switching structure in accordance with the embodiment. Thus, the dopant concentration in a region of the switching structure adjacent to the electrode can be sufficiently high to prevent the switching structure from being locally destroyed, i.e., to prevent breakdown of the switching structure, during an operation of the switching element. As a result, the operation of the switching element can be reliably performed.

In addition, by performing an ion implantation process for each of the unit insulation layers of the entire switching layer, the ion implantation process according to an embodiment of the present disclosure can be performed with a relatively low ion implantation energy compared with when a single ion implantation process is performed on the similar structure. As a result, a physical damage resulting from the ion implantation process can be reduced, thereby improving the structural reliability and the operation reliability of the switching element, according to the embodiment.

Figure 11A:
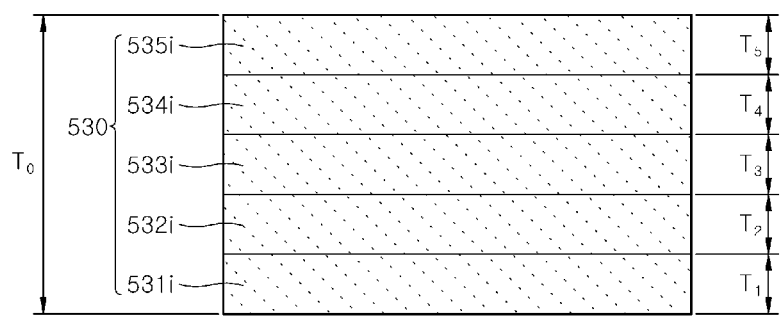
FIG. 11A is a cross-sectional view illustrating a switching structure of a switching device according to an embodiment.
Figure 11B:
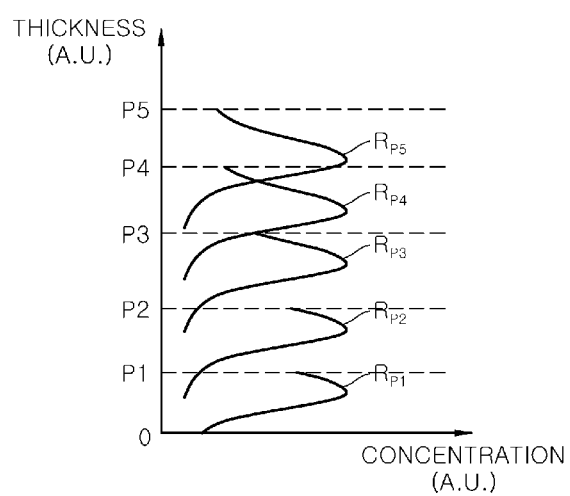
FIG. 11B is a graph illustrating a plurality of dopant concentration distributions resulting from a plurality of ion implantation processes to respectively form unit switching layers of the switching structure of FIG. 11A.
Figure 11C:
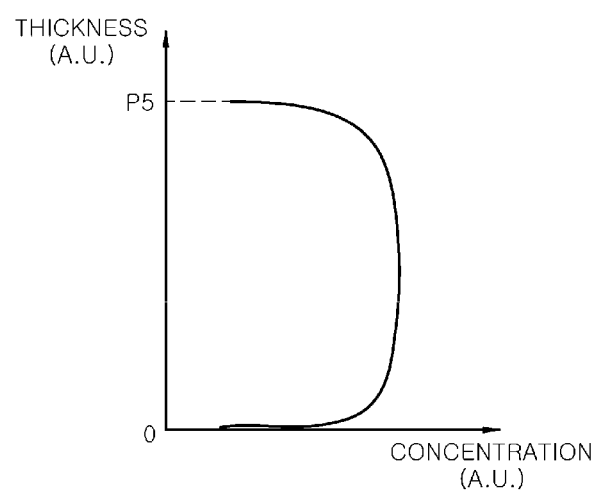
FIG. 11C is a graph illustrating a total dopant concentration distribution in the switching structure of FIG. 11B.

FIG. 11A is a cross-sectional view illustrating a switching structure 530 of a switching element according to an embodiment. FIG. 11B is a graph schematically illustrating a plurality of dopant concentration distributions resulting from a plurality of ion implantation processes to respectively form unit switching layers of the switching structure 530 of FIG. 11A. FIG. 11C is a graph schematically illustrating a total dopant concentration distribution in the switching structure 530 of FIG. 11A.

Referring to FIG. 11A, the switching structure 530 may be formed to include five unit switching layers 531$i$, 532$i$, 533$i$, 534$i$, and 535$i$. The first to fifth unit switching layers 531$i$, 532$i$, 533$i$, 534$i$, and 535$i$ may have thicknesses T1, T2, T3, T4, and T5, respectively, and the switching structure 530 may have a thickness $T_0$ that corresponds to the sum of the thicknesses T1, T2, T3, T4, and T5. In FIG. 11B, reference numerals P1, P2, P3, P4, and P5 represent locations of top surfaces of the first to fifth unit switching layers 531$i$, 532$i$, 533$i$, 534$i$, and 535$i$, respectively.

As described above, each of the first to fifth unit switching layers 531$i$, 532$i$, 533$i$, 534$i$, and 535$i$ may be formed by performing a unit insulation layer forming process and an ion implantation process for injecting dopants into the unit insulation layer. In addition, a post-dopant injection process may be additionally performed.

FIG. 11B illustrates dopant concentration distributions in the first to fifth unit switching layers 531$i$, 532$i$, 533$i$, 534$i$, and 535$i$, which are respectively formed by performing dopant injection processes for unit insulation layers corresponding to the first to fifth unit switching layers 531$i$, 532$i$, 533$i$, 534$i$, and 535$i$. The dopant injection processes may be performed under process conditions to locate projection range points $R_{p1}$, $R_{P2}$, $R_{p3}$, $R_{p4}$, and $R_{p5}$ of the ion implantation processes inside the corresponding unit insulation layers, respectively. Accordingly, a total dopant concentration distribution of the entire switching structure 530 may be substantially uniform along a thickness direction of the switching structure 530, as shown in FIG. 11C.

Figure 12A:
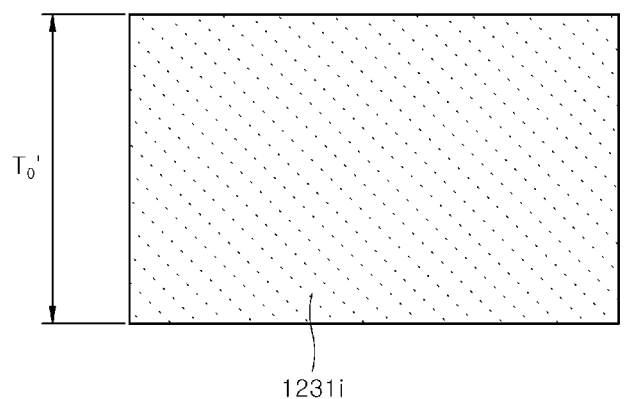
FIG. 12A is a cross-sectional view of a switching structure of a switching device according to a comparative example.
Figure 12B:
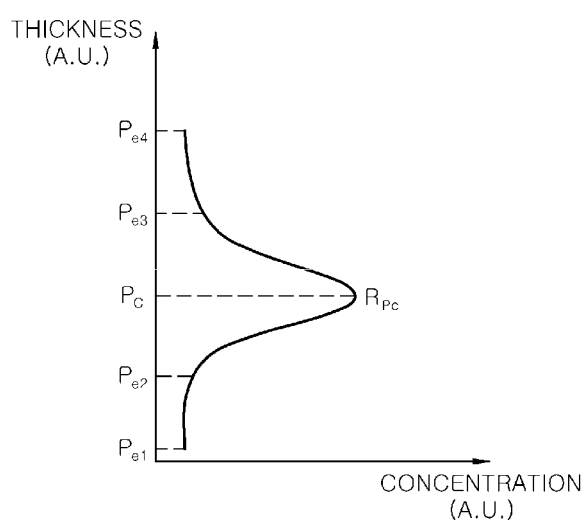
FIG. 12B is a graph illustrating a dopant concentration distribution in the switching structure of FIG. 12A.

FIG. 12A is a cross-sectional view of a switching structure 1231$i$ of a switching element according to a comparative example. FIG. 12B is a graph schematically illustrating a dopant concentration distribution in the switching structure 1231$i$ of FIG. 12A.

Referring to FIG. 12A, the switching structure 1231$i$ may be formed by forming an insulation layer having a thickness $T_0'$ and injecting dopants into the insulation layer. In a case that the thickness $T_0'$ of the switching structure 1231$i$ is substantially the same as the thickness $T_0$ of the switching structure 530 of the embodiment shown in FIGS. 11A to 11C, and a single dopant injection process is performed, the dopant concentration in the switching structure 1231$i$ may have a distribution shown in FIG. 12B. In such a case, the dopant concentration distribution may have a projection range point $R_{pc}$ of the ion implantation process at a center point $Pc_c$, which corresponds to a half of the thickness $T_0'$ of the switching structure 1231$i$, and the dopant concentration distribution may be a Gaussian distribution having the projection range point $R_{pc}$ as a concentration peak.

Comparing with the total dopant concentration distribution shown in FIG. 11C according to the embodiment of the present disclosure, the dopant concentration distribution of the switching structure 1231$i$ of the comparative example is less uniform in a thickness direction. Specifically, in FIG. 12B, a significant decrease in the dopant concentration distribution occurs in a first region between the center point $P_c$ and a second point $P_{e2}$ and in a second region between the center point $P_c$ and a third point $P_{e3}$. As a result, the dopants may be distributed at a low concentration in outer regions adjacent to first and second electrodes, that is, referring to FIG. 12B, in a first outer region between the third $P_{e3}$ point and a fourth $P_{e4}$ point, and a second outer region between the second point $P_{e2}$ point and a first point $P_{e1}$ of the switching structure 1231$i$.

Due to the low dopant concentration, the density of trap sites for conductive carriers in the first and second outer regions may be reduced. If the density of the trap sites in the outer regions is reduced, the probability of an occurrence of a breakdown of the switching structure 1231$i$ in at least one of the outer regions may be increased. The breakdown of the switching structure 1231$i$ may cause a leakage phenomenon in the corresponding outer region and degrade the operation reliability of a switching element that includes the switching structure 1231$i$ of the comparative example.

Meanwhile, in the comparative example, in a case that one or more ion implantation processes are additionally performed with different ion implantation energy levels to make the dopant concentration substantially uniform in the thickness direction, the switching structure 1231$i$ may be physically damaged by the additionally performed ion implantation processes. As a result, the structural reliability and operation reliability of the switching element that includes the switching structure 1231$i$ of the comparative example may be further degraded by the physical damage of the switching structure 1231$i$. In contrast, using a manufacturing method of a switching element according an embodiment of the present disclosure, it is possible to make the dopant concentration distribution in a switching structure substantially uniform in a thickness direction, and thus an additional ion implantation process may not be performed. As a result, any physical damage applied to the switching structure during such an additional ion implantation process can be prevented. As a result, the physical reliability and operation reliability of the switching element according to the embodiment can be improved.

Figure 13:
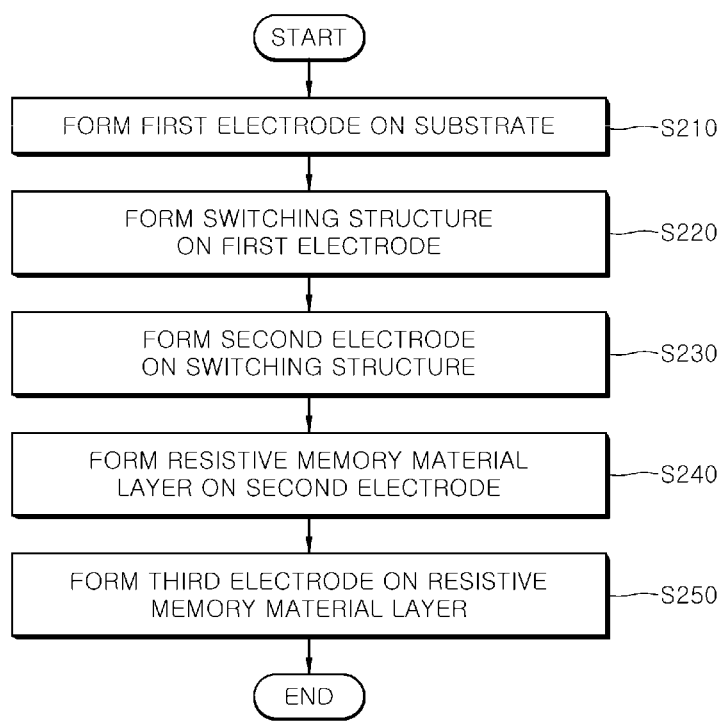
FIG. 13 is a flow chart illustrating a method of fabricating a resistive random access memory (ReRAM) device according to an embodiment.
Figure 14:
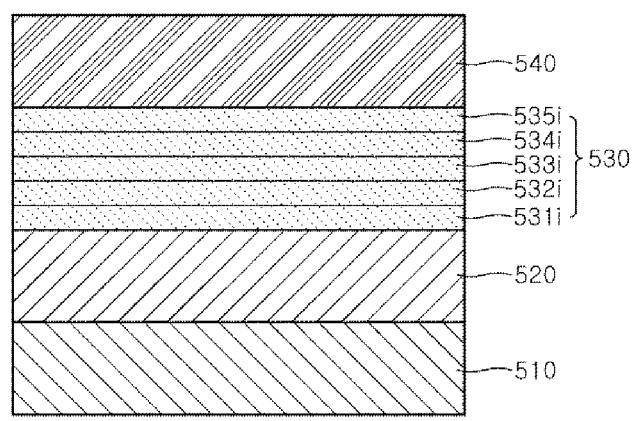
FIGS. 14 to 15 are cross-sectional views illustrating a method of manufacturing a resistive random access memory (ReRAM) device according to an embodiment.
Figure 15:
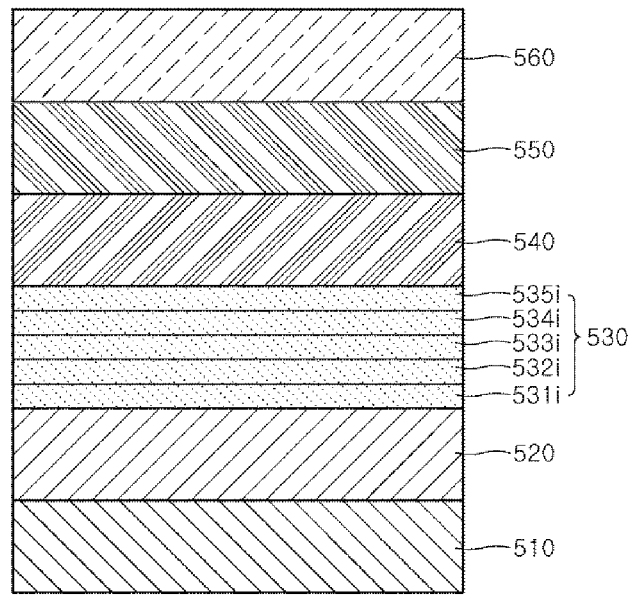

FIG. 13 is a flow chart illustrating a method of manufacturing an ReRAM device according to an embodiment. FIGS. 14 to 15 are cross-sectional views illustrating a method of manufacturing an ReRAM device according to an embodiment. The method of manufacturing the ReRAM device according to the embodiment of the present disclosure may include the method of manufacturing the cross-point array device 1 described above with reference to FIGS. 1 and 2.

Referring to FIGS. 13 and 14, at step S210, a first electrode layer 520 may be formed on a substrate 510. At step S220, a switching structure 530 may be formed on the first electrode layer 520. At step S230, a second electrode layer 540 may be formed on the switching structure 530. Step S210 to step S230 may correspond to processes of manufacturing a selection element of the ReRAM device. The selection element may correspond to the selection element 31 of the embodiment shown in FIG. 2.

Referring to FIGS. 13 and 15, at step S240, a resistive memory material layer 550 may be formed on the second electrode layer 540. The resistive memory material layer 550 may have a resistance value that switches from a high resistive state to a low resistive state or from the low resistive state to the high resistive state, according to a level or a polarity of an external voltage applied thereto. In addition, when the external voltage is not applied, the resistive memory material layer 550 may have a memory function that keeps a certain resistance value.

In some embodiments, the resistive memory material layer 550 may include a metal oxide material such as a titanium oxide material, an aluminum oxide material, a nickel oxide material, a copper oxide material, a zirconium oxide material, a manganese oxide material, a hafnium oxide material, a tungsten oxide material, a tantalum oxide material, a niobium oxide material, or an iron oxide material. In other embodiments, the resistive memory material layer 550 may include a perovskite material such as a praseodymium calcium manganese oxide ($Pr_{0.7}Ca_{0.3}MnO_3$) material, a $La_{1-x}Ca_xMnO_3$ (LCMO) material, a $Ba_{0.5}Sr_{0.5}Co_{0.8}Fe_{0.2}O_{3-\delta}$ (BSCFO) material, a $YBa_2Cu_3O_{7-x}$ (YBCO) material, a $(Ba,Sr)TiO_3$(Cr,Nb-doped) material, a $SrZrO_3$(Cr,V-doped) material, a (La,Sr)$MnO_3$ material, a $Sr_{1-x}La_xTiO_3$ material, a $La_{1-x}Sr_xFeO_3$ material, a $La_{1-x}Sr_xCoO_3$ material, a $SrFeO_{2.7}$ material, a $LaCoO_3$ material, a $RuSr_2GdCu_2O_3$ material, or a $YBa_2Cu_3O_7$ material. In yet other embodiments, the resistive memory material layer 550 may include a selenide material such as a $Ge_xSe_{1-x}$(Ag,Cu,Te-doped), or a metal sulfide material, for example, an $Ag_2S$ material, a $Cu_2S$ material, a CdS material, or a ZnS material.

In some embodiments, the resistive memory material layer 550 may be formed using a sputtering method, an atomic layer deposition (ALD) method, a vaporization method, a chemical vapor deposition (CVD) method, an electron beam deposition method, or the like.

At step S250, a third electrode layer 560 may be formed on the resistive memory material layer 550. The third electrode layer 560 may include a metal material, a conductive metal nitride material, a conductive metal oxide material, or the like. In some embodiments, the third electrode layer 560 may include gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), ruthenium oxide ($RuO_2$), or the like.

Step S230 to step S250 may correspond to processes of manufacturing a resistive element of the ReRAM device. The resistive element may correspond to the resistive element 32 shown in FIG. 2. At this time, the second electrode layer 540 may be shared by the selection element and the resistive element of the ReRAM device.

Although it is not illustrated, the third electrode layer 560, the resistive memory material layer 550, the second electrode layer 540, the switching structure 530, and the first electrode layer 520 may be patterned to form a pattern structure on the substrate 510. The pattern structure may correspond to the pillar-shaped structure 30 shown in FIGS. 1 and 2.

By performing the above-described processes, an ReRAM device according to an embodiment can be manufactured. In the embodiment, it is illustrated that a selection element and a resistive element are sequentially stacked on the substrate 510 to form a unit cell of the ReRAM device. However, in other embodiments, alternatively, the resistive element may be formed on the substrate 510, and then the selection element may be formed on the resistive element. More specifically, after sequentially stacking the second electrode layer 540, the resistive memory material layer 550, and the third electrode layer 560 on the substrate 510, the switching structure 530 and the first electrode layer 520 may be sequentially stacked over the third electrode layer 560. In this case, the selection element is disposed on the resistive element, and the resistive element and the selection element share the third electrode layer 560.

Hereinafter, a configuration and an operation of a switching element according to an embodiment of the present disclosure will be described in more detail.

Embodiment

An insulation substrate is provided for each of switching elements according to a comparative example and an embodiment. A titanium nitride layer is deposited on the insulation substrate as a first electrode layer.

In a case of the switching element according to the comparative example, a silicon oxide layer is deposited on the titanium nitride layer using a chemical vapor deposition process to have a thickness of 20 nm. Then, boron (B) ions are implanted into the silicon oxide layer at an implantation energy of 10 keV. Subsequently, a titanium nitride layer is deposited on the boron-implanted silicon oxide layer as a second electrode layer.

In a case of the switching element according to the embodiment, after depositing a silicon oxide layer on the titanium nitride layer to have a thickness of 10 nm using a chemical vapor deposition process, boron (B) ions are implanted into the silicon oxide layer at an implantation energy of 5 keV. For example, a dose of the boron ions implanted in the embodiment is substantially equal to a dose of the boron ions implanted in the comparative example. After that, another silicon oxide layer is formed on the boron-implanted silicon oxide layer to have a thickness of 10 nm using a chemical vapor deposition process, and then boron (B) ions are implanted into the other silicon oxide layer at an implantation energy of 5 keV. That is, the process of forming the boron-implanted silicon oxide layer is repeated twice to form a switching element including two boron-implanted silicon oxide layers. Subsequently, a titanium nitride layer is deposited on the other boron-implanted silicon oxide layer as the second electrode layer.

Experimental Example

A voltage was applied to the first electrode layer and the second electrode layer of the respective switching elements of the comparative example and the embodiment, and an operation current according to an increase of the applied voltage was measured. In a positive measurement mode, a positive bias was applied to the second electrode layer with respect to the first electrode layer, and a current was measured while increasing the voltage from 0 V. Specifically, a first voltage applied to the second electrode layer increased from 0 V while the first electrode layer was connected to a ground. Meanwhile, in a negative measurement mode, a negative bias was applied to the second electrode layer with respect to the first electrode layer, a current was measured while increasing the voltage from 0 V.

With respect to the switching elements of the comparative example and the embodiment, the current measurement was performed in the order of a first positive measurement mode, a first negative measurement mode, a second positive measurement mode, and a second negative measurement mode. That is, the current measurement was performed twice in the positive measurement mode and the negative measurement mode, respectively.

Figure 16:
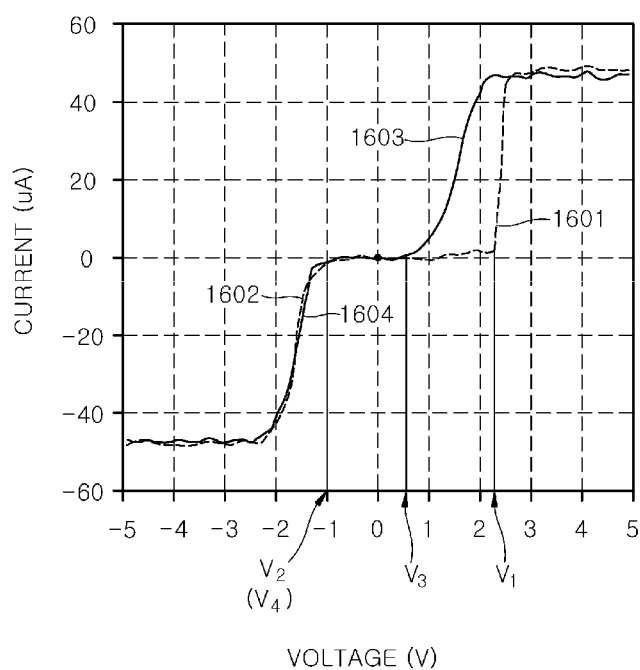
FIG. 16 illustrates a voltage-current characteristic of a switching device according to a comparative example.
Figure 17:
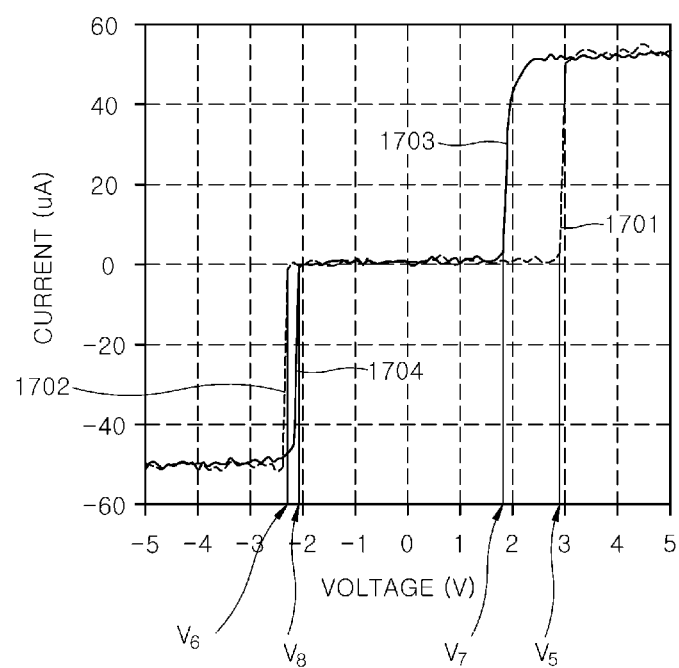
FIG. 17 illustrates a voltage-current characteristic of a switching device according to an embodiment.

FIG. 16 illustrates a voltage-current characteristic of the switching element according to the comparative example. FIG. 17 illustrates a voltage-current characteristic of the switching element according to the embodiment.

FIG. 16 illustrates current measurement results of the switching element of the comparative example in the first positive measurement mode, the first negative measurement mode, the second positive measurement mode, and the second negative measurement mode as a first dashed line 1601, a second dashed line 1602, a first solid line 1603, and a second solid line 1604, respectively. Similarly, FIG. 17 illustrates current measurement results of the switching element of the embodiment in the first positive measurement mode, the first negative measurement mode, the second positive measurement mode, and the second negative measurement mode as a first dashed line 1701, a second dashed line 1702, a first solid line 1703, and a second solid line 1704, respectively.

Referring to FIG. 16, in the first and second positive measurement modes, first and third voltages V1 and V3 at which first and second currents start to nonlinearly increase were measured to be about 2.3 V and about 0.7 V, respectively. Accordingly, the third voltage V3 at which the second current starts to nonlinearly increase in the second positive measurement mode is decreased by about 1.6 V relative to the first voltage V1 at which the first current starts to nonlinearly increase in the first positive measurement mode. In addition, referring to FIG. 16, a slope of the first solid line 1603 of the second positive measurement mode is smaller than a slope of the first dashed line 1601 of the first positive measurement mode.

By comparison, referring to FIG. 17, in the first and second positive measurement modes, fifth and seventh voltages V5 and V7 at which first and second currents start to nonlinearly increase were measured to be about 2.9 V and about 1.9 V, respectively. Accordingly, the seventh voltage V7 at which the second current begins to nonlinearly increase in the second positive measurement mode is decreased by about 1.0 V relative to the fifth voltage V5 at which the first current starts to nonlinearly increase in the first positive measurement mode. In addition, referring to FIG. 17, a slope of the first solid line 1703 of the second positive measurement mode is substantially equal to a slope of the first dashed line 1701 of the first positive measurement mode.

From the measurement results, the switching element according to the embodiment is excellent in the operation reliability compared with the switching element according to the comparative example. In the case of the switching element of the comparative example, the third voltage V3 at which the second current starts to nonlinearly increase is about 0.7 V in the second positive measurement mode, therefore, the operation of the switching element of the comparative example may not be reliably performed.

The current measurement results in the first negative measurement mode and the second negative measurement mode show a similar trend for the respective switching elements of the comparative example and the embodiment. However, in the case of the switching element of the comparative example, second and fourth voltages V2 and V4 at which first and second currents start to nonlinearly change in the first and second negative measurement modes, respectively, were measured to about −1.0V. On the other hand, in the case of the switching element of the embodiment, sixth and eighth voltages V6 and V8 at which first and second currents start to nonlinearly change in the first and second negative measurement modes were measured to about −2.3 V and −2.1 V, respectively. That is, absolute values of the second and fourth voltages V2 and V4 of the switching element of the comparative example are smaller than corresponding absolute values of the sixth and eighth voltages V6 and V8 of the switching element of the embodiments.

In addition, slopes of the second dashed and solid lines 1602 and 1604 in the first and second negative measurement modes, respectively, of the switching element of the comparative example in FIG. 16 are smaller than slopes of the second dashed and solid lines 1702 and 1704 in the first and second negative measurement modes, respectively, of the switching element of the embodiment in FIG. 17. From the measurement results, it is determined that the switching element of the embodiment is excellent in the operation reliability compared with the switching element of the comparative example.

Embodiments of the present disclosure have been disclosed above for illustrative purposes. Those of ordinary skill in the art will appreciate that various modifications, additions and substitutions are possible.

What is claimed is:

1. A method of manufacturing a switching element comprising:
    forming a first electrode layer over a substrate;
    forming a switching structure on the first electrode layer, the switching structure including a plurality of unit switching layers that includes a first unit switching layer and a second unit switching layer; and
    forming a second electrode layer on the switching structure,
    wherein forming the first unit switching layer comprises:
        forming a first unit insulation layer; and
        injecting first dopants into the first unit insulation layer by performing a first ion implantation process, thereby forming the first unit switching layer, and
    wherein forming the second unit switching layer comprises:
        forming a second unit insulation layer directly on the first unit switching layer; and
        injecting second dopants into the second unit insulation layer by performing a second implantation process, thereby forming the second unit switching layer.

2. The method of claim 1, wherein each of the first and second ion implantation processes causes the first dopants or the second dopants to have a respective distribution with a projection range point that is located inside a corresponding one of the first and second unit switching layers.

3. The method of claim 1, wherein at least one of a dopant type, ion implantation energy, and a dose of the first dopants in the first ion implantation process is different from a corresponding one in the second ion implantation process.

4. The method of claim 1, wherein a dopant type of the first dopants is the same as that of the second dopants, and
    wherein the ion implantation energy and the dose of the first dopants in the first ion implantation process are substantially the same as those in the second ion implantation process.

5. The method of claim 1, further comprises:
    performing a post-dopant injection process after forming the first unit switching layer and the second unit switching layer.

6. The method of claim 5, wherein a dose of dopants in the post-dopant injection process is higher than a dose of at least one of the first dopants and the second dopants.

7. The method of claim 1, wherein at least one of forming the first unit insulation layer and forming the second unit insulation layer comprises forming a compound layer having an amorphous composition.

8. The method of claim 1, wherein at least one of forming the first unit insulation layer and forming the second unit insulation layer comprises forming a compound layer having a composition that does not satisfy a stoichiometric ratio.

9. The method of claim 1, wherein one of the first and second unit insulation layers comprises an oxide material of a first element or a nitride material of the first element, and
    wherein corresponding dopants in the one of the first and second unit switching layers comprise a second element having an atomic number that is different from an atomic number of the first element.

10. The method of claim 9, wherein the first element comprises silicon or a metal element.

11. The method of claim 9, wherein the one of the first and second unit insulation layers comprises a silicon oxide material or a silicon nitride material, and
wherein the corresponding dopants comprise at least one selected from the group consisting of aluminum (Al), lanthanum (La), niobium (Nb), vanadium (V), tantalum (Ta), tungsten (W), chrome (Cr), molybdenum (Mo), boron (B), nitrogen (N), carbon (C), phosphorus (P), and arsenic (As).

12. The method of claim 9, wherein the one of the first and second unit insulation layers comprises an aluminum oxide material or an aluminum nitride material, and
wherein the corresponding dopants comprise at least one selected from the group consisting of titanium (Ti), copper (Cu), zirconium (Zr), hafnium (Hf), niobium (Nb), vanadium (V), tantalum (Ta), tungsten (W), chrome (Cr), molybdenum (Mo), boron (B), nitrogen (N), carbon (C), phosphorus (P), and arsenic (As).

13. The method of claim 1, wherein the first and second dopants are selected to generate trap sites that capture conductive carriers, or provide a moving path of the conductive carriers between the first electrode layer and the second electrode layer, according to a voltage applied to a pillar-shaped structure including the switching element.

14. The method of claim 13, wherein forming the switching structure includes mitigating a density decrease of the trap sites in a first outer region of the switching structure adjacent to the first electrode layer, and in a second outer region of the switching structure adjacent to the second electrode layer.

15. The method of claim 1, further comprises patterning the second electrode layer, the switching structure, and the first electrode layer to form a pattern structure over the substrate.

16. A method of manufacturing a resistive memory device, the method comprising:
forming a first electrode layer over a substrate;
forming a switching structure on the first electrode layer, the switching structure including a plurality of unit switching layers that includes a first unit switching layer and a second unit switching layer;
forming a second electrode layer on the switching structure;
forming a resistive memory material layer on the second electrode layer; and
forming a third electrode layer on the resistive memory material layer,
wherein forming the first unit switching layer comprises:
forming a first unit insulation layer; and
injecting first dopants into the first unit insulation layer by performing a first ion implantation process, thereby forming the first unit switching layer, and
wherein forming the second unit switching layer comprises:
forming a second unit insulation layer directly on the first unit switching layer; and
injecting second dopants into the second unit insulation layer by performing a second implantation process, thereby forming the second unit switching layer.

17. The method of claim 16, wherein each of the first and second ion implantation processes causes the first dopants or the second dopants to have a respective distribution with a projection range point that is located inside a corresponding one of the first and second unit switching layers.

18. The method of claim of 16, wherein at least one of a dopant type, ion implantation energy, and a dose of the first dopants in the first ion implantation process is different from a corresponding one in the second ion implantation process.

19. The method of claim 16, wherein a dopant type of the first dopants is the same as that of the second dopants, and
wherein the ion implantation energy and the dose of the first dopants in the first ion implantation process are substantially the same as those in the second ion implantation process.

20. The method of claim 16, further comprises performing a post-dopant injection process after forming the first unit switching layer and the second unit switching layer.

* * * * *